(12) United States Patent
Liikanen

(10) Patent No.: US 10,665,309 B2
(45) Date of Patent: May 26, 2020

(54) MEMORY ENDURANCE MEASURES BASED ON AN EXTRAPOLATED FUNCTION FIT TO METRIC POINTS FOR A MEMORY SUB-SYSTEM

(71) Applicant: Micron Technology, Inc., Boise, ID (US)

(72) Inventor: Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/106,663

(22) Filed: Aug. 21, 2018

(65) Prior Publication Data

US 2020/0066364 A1 Feb. 27, 2020

(51) Int. Cl.
*G11C 16/34* (2006.01)
*G11C 29/56* (2006.01)
*G06F 11/07* (2006.01)
*G06F 11/34* (2006.01)
*G06F 16/901* (2019.01)

(52) U.S. Cl.
CPC ........ *G11C 16/3495* (2013.01); *G06F 11/073* (2013.01); *G06F 11/0754* (2013.01); *G06F 11/3485* (2013.01); *G06F 16/9024* (2019.01); *G11C 29/56008* (2013.01)

(58) Field of Classification Search
CPC .......... G11C 16/3495; G11C 29/56008; G06F 16/9024; G06F 11/073; G06F 11/0754; G06F 11/3485
See application file for complete search history.

(56) References Cited

U.S. PATENT DOCUMENTS

| 2016/0179406 A1* | 6/2016 | Gorobets | ............... | G11C 16/28 711/103 |
| 2016/0179602 A1* | 6/2016 | Gorobets | ............... | G11C 16/32 714/47.2 |
| 2017/0221573 A1* | 8/2017 | Darragh | ............... | G06F 11/076 |

* cited by examiner

*Primary Examiner* — Gene N Auduong
(74) *Attorney, Agent, or Firm* — Perkins Coie LLP

(57) ABSTRACT

Aspects of the present disclosure are directed to generating endurance measures for a memory sub-system and using endurance measures to classify memory sub-systems, to predict memory system remaining life, and to create memory systems with consistently performing sub-systems. An endurance measure can be generated by computing multiple metric points. Each metric point can be based on a margin between a point, in cumulative distribution function (CDF)-based data at an acceptable memory unit failure rate, and an error amount threshold condition. Once a there are sufficient metric points related to the memory device, the metric points can be fit to a function. The endurance measure is then obtained by extrapolating the function to a point at which the function reaches a threshold.

20 Claims, 5 Drawing Sheets

US 10,665,309 B2

MEMORY ENDURANCE MEASURES BASED ON AN EXTRAPOLATED FUNCTION FIT TO METRIC POINTS FOR A MEMORY SUB-SYSTEM

TECHNICAL FIELD

The present disclosure generally relates to a memory sub-system, and more specifically, relates to memory endurance in the memory sub-system.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
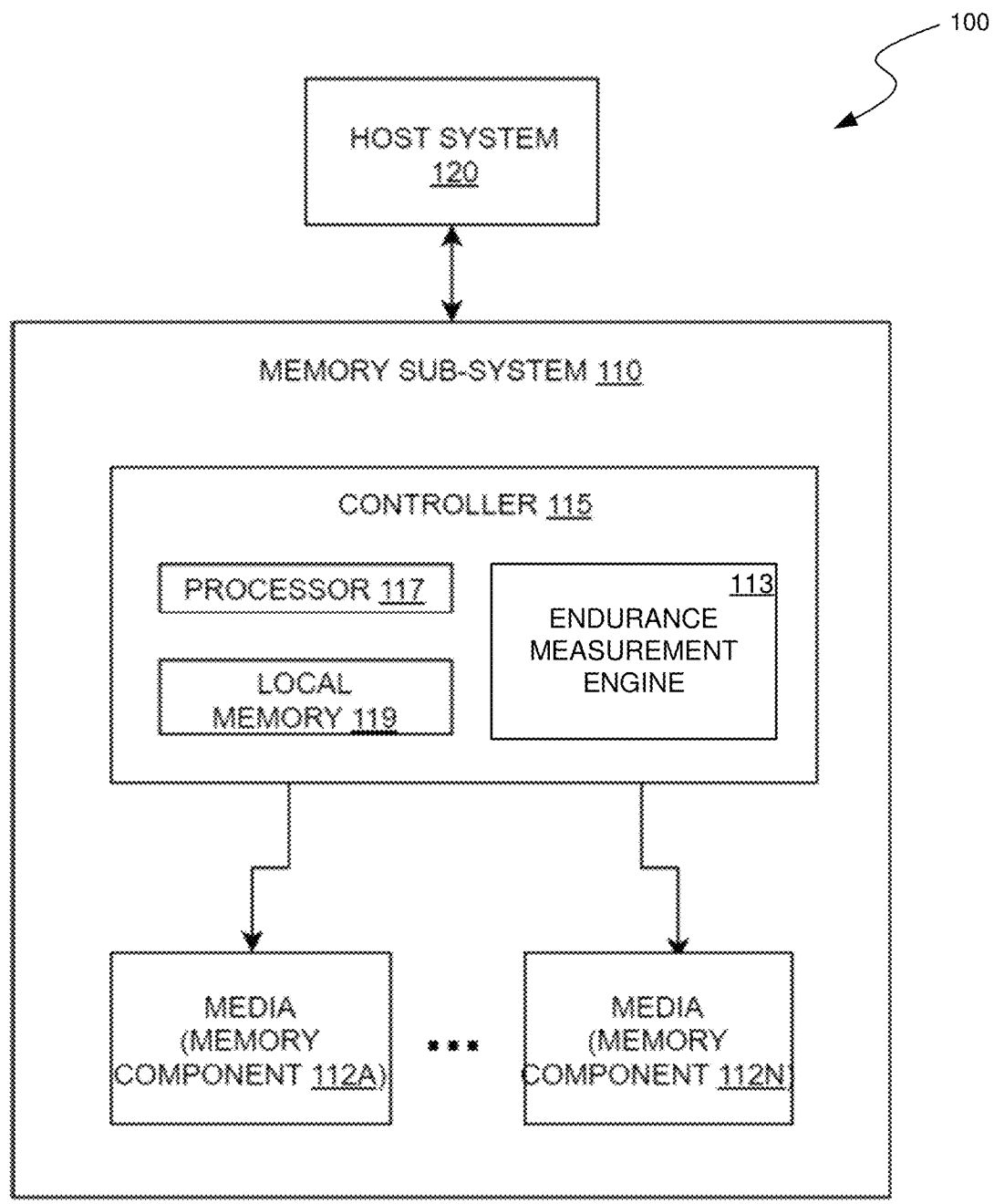
FIG. 1 illustrates an example computing environment that includes a memory sub-system in accordance with some embodiments of the present disclosure.

Aspects of the present disclosure are directed to generating endurance measures for a memory sub-system. Additional aspects of the present disclosure are directed to using endurance measures to classify memory sub-systems. The generated endurance measures or classifications can be used to predict memory system remaining life or to create memory systems with consistently performing sub-systems. A memory sub-system is also hereinafter referred to as a "memory device". An example of a memory sub-system is a storage system, such as a solid-state drive (SSD). In some embodiments, the memory sub-system is a hybrid memory/storage sub-system. In various implementations, a memory sub-system can include non-volatile memory devices, such as, for example, negative-and (NAND). In general, a host system can utilize a memory sub-system that includes one or more memory components. The host system can provide data to be stored at the memory sub-system and can request data to be retrieved from the memory sub-system.

In conventional memory systems, it is difficult to accurately predict a remaining endurance (e.g. a number of operations, amount of time in use, etc.) before a memory device will fail. "Failure" here refers to ceasing to operate or to falling below an acceptable performance level, e.g. as a result of errors requiring correction occurring at a rate that results in unacceptable delay. Furthermore, conventional memory systems include multiple memory devices that fail at different times. This results in the performance of some of the memory systems falling below acceptable levels, e.g. requiring the memory systems to be replaced, while a significant portion of the memory devices included in the memory systems still operate at acceptable levels.

Aspects of the present disclosure address the above and other deficiencies by providing a method for accurately predicting an endurance measure of a memory device. This method can include computing multiple metric points at various times for a memory device and fitting the metric points to a function. An endurance measure can correspond to an intersection of the function and a threshold relating to an error rate at which the memory device is considered to have failed. In some implementations, each metric point can be computed in response to a trigger, such as dynamic program step (DPS) updates, a timer reaching a threshold (e.g., counting down to zero from a predetermined value, or counting up to a predetermined value), an I/O operation count reaching a limit, a drive fill count reaching a limit, or the like. In some implementations, each metric point can represent a magnitude of a margin between an amount of errors that occur in a particular number of memory units and a threshold amount of errors. In other implementations, each metric point can represent a magnitude of a margin between an amount of errors that occur in a particular number of memory units and a threshold area under a portion of a curve defined by error frequencies. In these and other implementations, each metric point can be based on CDF-based data.

Additional aspects of the present disclosure address the above and other deficiencies by using endurance measures corresponding to memory devices to classify the memory devices. In some implementations, these classifications can be used to select similarly classified memory devices in the construction of a memory system. In other implementations, these classifications can be used to determining a remaining life of a drive, to monitor product quality or review manufacturing procedures. In these and other implementations, these classifications can be used to detect abnormal failures.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes an endurance measurement engine 113 that can be used to generate an endurance measure for a memory device by computing multiple metric points or can be used to classify memory devices based on endurance measures. In some embodiments, the controller 115 includes at least a portion of the endurance measurement engine 113. For example, the controller 115 can include a processor 117 (processing device) configured to execute instructions stored in local memory 119 for performing the operations described herein. In some embodiments, the endurance measurement engine 113 is part of the host system 110, an application, or an operating system.

The endurance measurement engine 113 can receive data such as error frequencies or other error amounts for memory units stored by memory components 112A to 112N of the memory sub-system 110. In some implementations, endurance measurement engine 113 can receive this error data at various times for a memory device, e.g. in response to triggers such as a DPS update, a timer reaching a threshold, a number of drive fills reaching a limit, or a number of I/O operations reaching a limit. The endurance measurement engine 113 can use these various instances of receiving error data to compute and store metric points, can fit these metric points to a function, and can use the function to project when the function will intersect with a threshold corresponding to a failure condition. Such an intersection point can be considered an endurance measure for the memory device. The endurance measurement engine 113 can store the endurance measures at memory components 112A to 112N. The endurance measurement engine 113 can also use the endurance measures to classify various memory devices and can select memory devices with sufficiently similar endurance measures (e.g. within a similar threshold amount of each other) to be used in building a memory system. Further details with regards to the operations of the endurance measurement engine 113 are described below.

Figure 2:
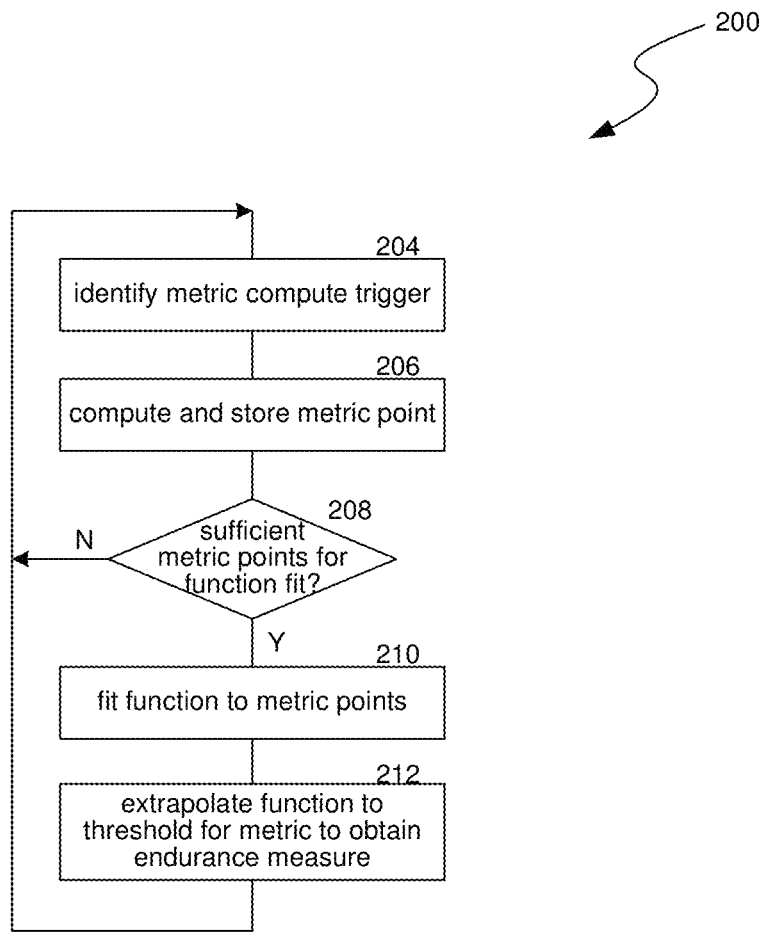
FIG. 2 is a flow diagram of generating an endurance measure for a memory device in accordance with some embodiments of the present disclosure.

FIG. 2 is a flow diagram of an example method 200 for generating an endurance measure for a memory device in accordance with some implementations of the present technology. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the endurance measurement engine 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 204, processing logic identifies that a metric compute trigger has occurred for a memory device. In some implementations, the memory device can be a portion (e.g. a die) of a memory sub-system (e.g. a SSD). In various implementations, a metric compute trigger can include an identification that a DPS update occurred, a metric compute timer maintained for the memory device reaching a threshold, a count of drive fills since the last metric compute trigger reaching a threshold, or a count of I/O operations since the last metric compute trigger reaching a threshold. In some implementations, only one of these metric compute triggers is tracked. In some implementations, any one of these metric compute triggers will trigger generating an endurance measure, resetting the other metric compute triggers to begin again. In some implementations, any one of these metric compute triggers will trigger generating an endurance measure, while the other metric compute triggers operate separately and can also trigger generating an endurance measure independent of when another of the metric compute triggers last triggered generating an endurance measure.

At block 206, a processing device computes and stores a metric point for the memory device. A metric point can be a result of a comparison between a performance quality measure for the memory device and an error amount threshold specifying an acceptable performance level. In some implementations, the comparison between the quality measure and the error amount threshold condition can be the difference between them. In some implementations, this comparison can be computed in decibels as 20*log(threshold_condition/error_amount) dB. In various implementations, the metric point can be a trigger margin, an uncorrectable error correction condition (UECC) margin, or a value based on an area under a CDF-based data graph. In some implementations, the metric point can be a normalization of one of these other metric point types.

In some implementations, a metric point can be computed by first obtaining quality measures for a memory device, such as a histogram of errors per memory unit (e.g. codeword or other memory unit). The quality measures can be converted into cumulative distribution function (CDF)-based data. CDF-based data is data that incorporates the CDF function of a set of data, where the CDF is the function whose value is the probability that a corresponding continuous random variable has a value less than or equal to a given value. For example, in terms of error measures of codewords in memory, the CDF-based data can specify, for a given amount of errors, the frequency of codewords that are expected have no more than that amount of errors. In some implementations, the CDF-based data can be 1-CDF, where the CDF is taken relative to the received histogram of quality measures.

The processing device can also obtain an error amount threshold condition and can determine a comparison between a quality measure obtained from the CDF-based data and the error amount threshold condition. In some implementations, the quality measure can be the CDF-based data at a particular y-axis coordinate. This type of quality measure can be compared to a given error amount threshold condition, e.g. such as a system trigger threshold or an UECC threshold, each of which can be set based on the error correction capabilities of a memory system. In some implementations, the error amount threshold condition can be a rate of memory units that can have a threshold amount of errors before the memory device will be considered to have failed. Failure, in this context, can mean any unacceptable level of performance, such as a speed deterioration (e.g. 5% slowdown) or an amount of data lost (e.g. $1/10^{15}$ bits unrecoverable).

In some implementations, the quality measure can be an area under the CDF-based data between two x-axis coordinates or a ratio of such an area to an area bounded by vertical lines at the two x-axis coordinates, a horizontal line at 0 on the y-axis, and a horizontal line at the y-axis coordinate of the largest point of the CDF-based data that is between the two x-axis coordinates. This type of quality measure can be compared to a given area or a given area ratio that has been determined to correspond to an acceptable error level.

The computed metric point can be stored in a log either corresponding to the memory device or in a general log with data correlating the metric point to the memory device. As used herein, a "log" can be any storage system that stores one or more metric points.

Depending on the metric compute trigger for this instance of generating an endurance measure, the processing device can also reset stored data used to create the metric point. For example, where the metric compute trigger is based on a timer, number of drive fills, or I/O operation count, the processing device can perform this reset. However, where the metric compute trigger is based on a DPS update, a reset may be performed as part of the DPS update and thus a further reset may not be needed.

At block 208, the processing device can determine whether the log has a sufficient amount of metric points associated with the memory device to act as a sufficiently accurate basis for a prediction of endurance for the memory device. For example, while a linear prediction function can be fit to as few as two data points, only having two data points may not be a sufficient amount of data points to expect that the prediction function will provide an accurate prediction of endurance. In various implementations, the amount of data points needed can be a specified number of metric points, an amount of metric points with each taken at least a threshold number of program/erase (P/E) cycles apart or an amount of time apart, an amount of metric points that have been taken within a most recent time or P/E cycle window, or any combination thereof. For example, at block 208, the processing device can continue to block 210 if there are at least 50 metric points for the memory device and the metric points are distributed such that at least five of the metric points are in each 1,000 P/E cycles of the last 10,000 P/E cycles. Otherwise, the processing device can return to block 204 to await another metric compute trigger.

At block 210, the processing device fits a function to one or more of the metric points from the log. In various implementations, the function can be a best fit for all the metric points in the log for the memory device or a best fit to metric points excluding outliers (e.g. metric points that are more than a set multiple of standard deviations from surrounding metric points). In some implementations, the function can be a best fit for metric points within a most recent time or P/E cycle window. In various implementations, the function can be linear, quadratic, cubic, or of another degree. In some implementations, the function can be the result of applying a machine learning algorithm that takes at least one of the metric points from the log as training data.

At block 212, the processing device computes an endurance measure for the memory device by extrapolating the function that was fit at block 210 to a point at which the function reaches a threshold for the metric. In some implementations, the threshold for the metric can be zero on the y-axis. For example, where the metric points are trigger margins between a performance measure and an acceptable performance level, zero on the y-axis is equal to the point where the trigger margin is zero, i.e. this is the point where a performance measure of the memory device is expected to be at the minimal acceptable performance level.

The endurance measure computed at block 212 can be used in various procedures for analyzing and improving memory systems. In some implementations, the endurance measure can be used to monitor quality in a memory system, e.g. to determine how devices from different manufacturers, with different capacities, operated with different parameters, etc., compare.

In some implementations, the endurance measure can be used as an input to determine system operating parameters. For example, parameters for operating individual memory devices or memory systems can be set based on the endurance measures of the memory device or devices making up the memory system. More specifically, parameters such as background scan frequency, power levels, clock frequency, etc. can be set based on the endurance measure of a memory device or a combined endurance measure for multiple memory devices of a memory system.

In these and other implementations, the endurance measure can be used to predict a remaining amount of life for a memory device or memory system. For example, an endurance measure below a threshold can be an indication that a memory device should be disabled. As another example, a combination of endurance measures from multiple die that make up an SSD can be determined, e.g. by averaging them, by identifying a percentage of die that have an endurance measure below a minimum value, etc. When this combined endurance measure is below a replacement threshold, it can be an indication the SSD should be replaced.

In still other implementations, the endurance measure can be used to classify memory devices prior to incorporating them in a memory system. Memory devices with the same or similar classifications can be used to build a memory system. For example, a group of die can be selected such that all of the endurance measures for the selected die are above a threshold. A memory system constructed with the selected die can be identified as a high performing SSD. Additional details on sorting die by endurance measures are provided below in relation to FIG. 3.

Moreover, in some implementations, the endurance measure can be used to determine if the failure of a memory device was due to a defect or other unusual circumstance. This can be accomplished by comparing an actual failure point of a memory device with one or more endurance measures for the memory device. If the actual failure point was more than a threshold amount different from a point indicated by the endurance measures, then this can indicate that an unusual occurrence, such as a select gate failure, caused the device failure.

Figure 3:
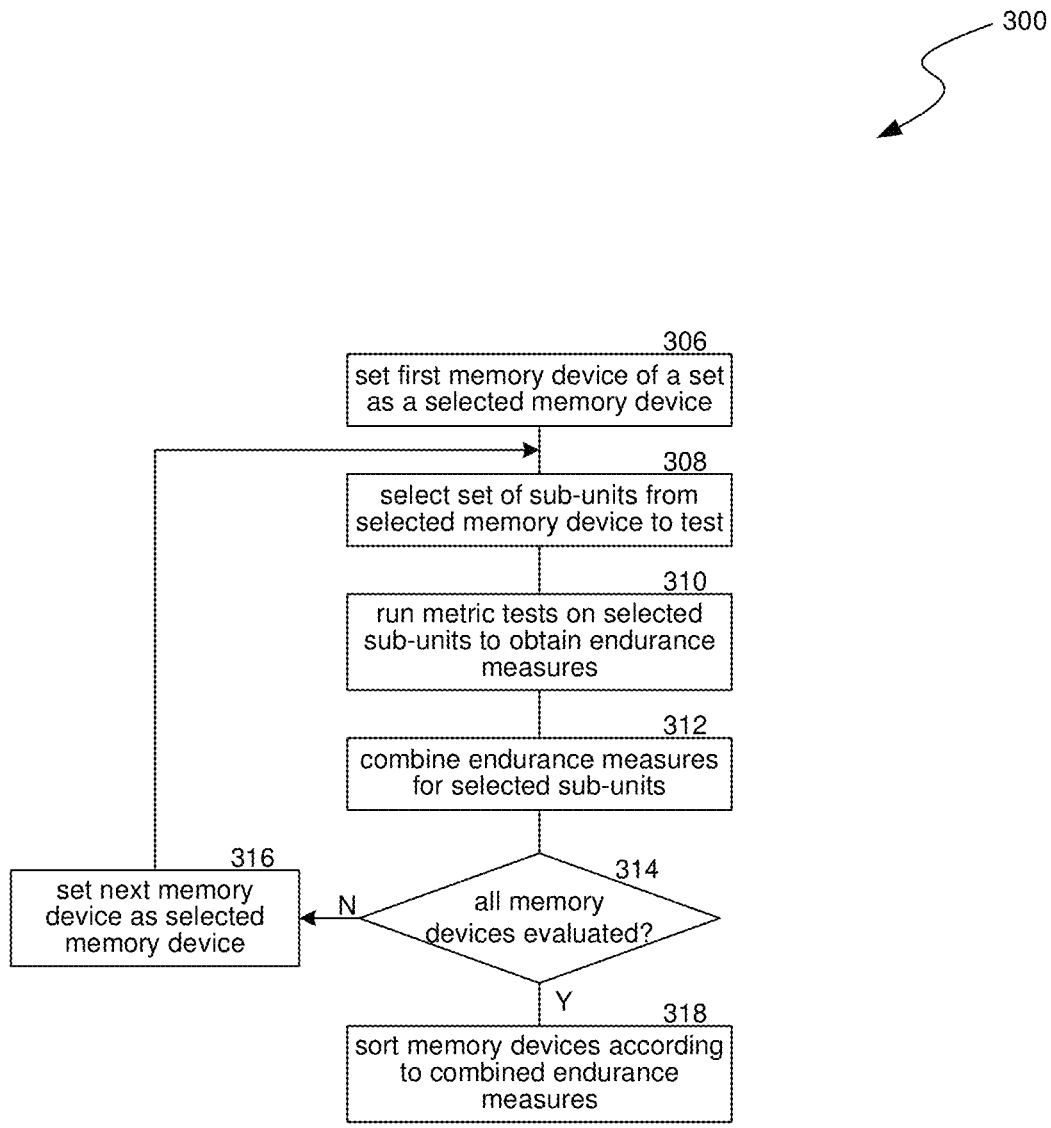
FIG. 3 is a flow diagram of grouping memory devices according to endurance measures in accordance with some embodiments of the present disclosure.

FIG. 3 is a flow diagram of an example method 300 for grouping memory devices according to endurance measures in accordance with some implementations of the present technology. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the endurance measurement engine 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Method 300 can operate in relation to an accessed set of memory devices to be sorted or otherwise classified based on endurance measures. In various implementations, the memory devices can be systems with multiple die, individual die, planes, blocks, or other memory device units. Accessing a memory device can include having an ability to perform operations on the memory device and receive results or can include receiving results of previously performed operations. For example, the access can be access through a controller of a memory system which allows the processing device to select individual die on which to perform endurance testing. As another example, the access can be access to a log of I/O operations results (e.g. error frequency data) or metric points (e.g. threshold margins, UECC margins, CDF-based area values, etc.) for each of the accessed set of die. In some implementations, the access can be access to results from one or more instances of method 200 that have been performed for a set of memory devices. In some implementations, the set of memory devices can be a set of available die for constructing a memory system. In some implementations, the set of memory devices can be a subset (e.g. random selection) of die for an existing memory system.

At block 306, the processing device sets a first memory device, of the accessed set of memory devices, as a selected memory device for operations performed in blocks 308-316. This selection can include specifying a particular memory device to perform operations on or selecting a subset of the data received at block 304 corresponding to a particular memory device.

At block 308, the processing device selects a subset of memory sub-units within the selected memory device. For example, the processing device can select a subset of blocks of a selected die. In some implementations, the sub-units can be selected randomly. In some implementations, the sub-units can be selected such that sub-unit selection is limited to only selecting sub-units that are at least a threshold distance from other, already-selected, sub-units.

At block 310, the processing device runs metric tests on each of the selected sub-units, to determine an endurance measure for each sub-unit. In some implementations, the processing device obtains these endurance measures from an instance of method 200 performed for each selected sub-unit. In some implementations, the processing device can cause method 200 to be performed for each selected sub-unit. In some implementations, the processing device can access results of method 200 previously performed for the selected sub-units.

At block 312, the processing device combines the endurance measures for the selected sub-units into a combined endurance measure for the selected memory device. This combination can include averaging the endurance measures, averaging the endurance measures excluding outlier endurance measures, taking a maximum or minimum endurance measure, etc.

At block 314, the processing device determines whether all the memory devices for which access was received at block 304 have been evaluated to have a combined endurance measure. If so, method 300 can proceed to block 318. If not, the processing device can proceed to block 316, where a next memory device of the accessed set of memory devices can be set as the selected memory device to be operated on at blocks 308-316.

At block 318, the processing device sorts the memory devices according to the combined endurance measures determined at block 312. In various implementations, this sorting can include classifying the memory devices according to pre-established ranges of combined endurance measures. For example, groups of devices with low, medium, and high classifications can be established for three corresponding ranges of combined endurance measures. In some implementations, memory devices can be classified in relative terms, e.g. a top percentage can be grouped in a high category while a bottom percentage can be grouped in the low category. Memory devices can be selected from one of the various groups to build memory systems, thus the resulting memory systems will be expected to have memory devices that last a similar amount of time or for a similar number of operations. These memory systems can then be marked for particular uses, such as drives created using the high-performance memory devices can be marketed as superior performance drives while drives created using the low-performance memory devices can be marketed as economy drives. In some implementations, memory devices with combined endurance measures below a threshold can be excluded from use in constructing memory systems.

In some implementations, the set of memory devices accessed at block 304 can already be incorporated in a memory system or across multiple memory systems. In such cases, the sorting of block 318 can be used to identify problem areas or usage patterns. For example, servers with low endurance measures might be performing excessive I/O operations on their memory systems, which could indicate a configuration setting problem, a need to replace hardware or provide improved hardware, or a need to implement different load balancing policies.

Figure 4B:
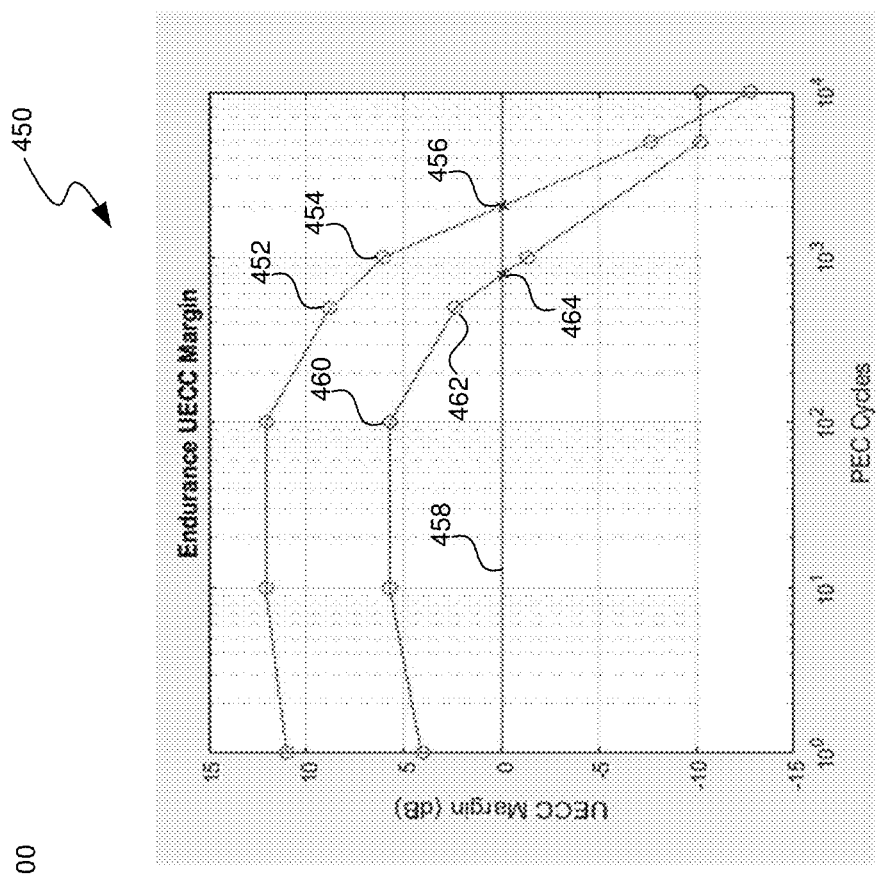
FIGS. 4A and 4B are graphs each illustrating multiple metric points with comparisons to a threshold, in accordance with some embodiments of the present disclosure.
Figure 4A:
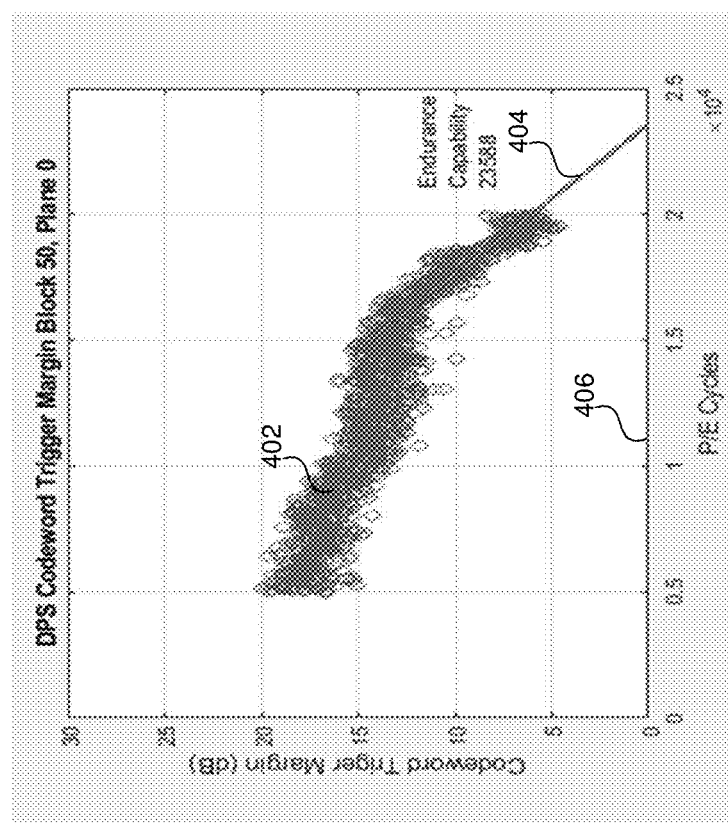

FIG. 4A is a graph illustrating examples of multiple trigger margin metric points for a memory device fit to a function for comparisons to a threshold at zero in accordance with some embodiments of the present disclosure. FIG. 4A shows multiple trigger margins for the memory device at various amounts of program/erase cycles, each represented by a data point indicating the size of the trigger margin at that point. The population of data points exhibits a generally downward slope 402. In FIG. 4A, a function 404 is fit to the trigger margins that are in the most recent 5,000 program/erase cycles. The intersection of this function with a threshold, defined by zero on the y-axis, gives an endurance measure of a total of 23,588 program/erase cycles expected before the memory device fails.

FIG. 4B is a graph illustrating examples of multiple trigger margin metric points and UECC margin points in relation to a threshold at zero in accordance with some embodiments of the present disclosure. FIG. 4B shows a graph of UECC metric points, such as points 452 and 453 and trigger margin metric points, such as points 460 and 462. At points 456 and 464, these graphs intersect with the threshold 458, defined at a margin of zero. These points indicate points of failure, e.g. where the level of performance of the memory device begins to be below an acceptable level.

Figure 5:
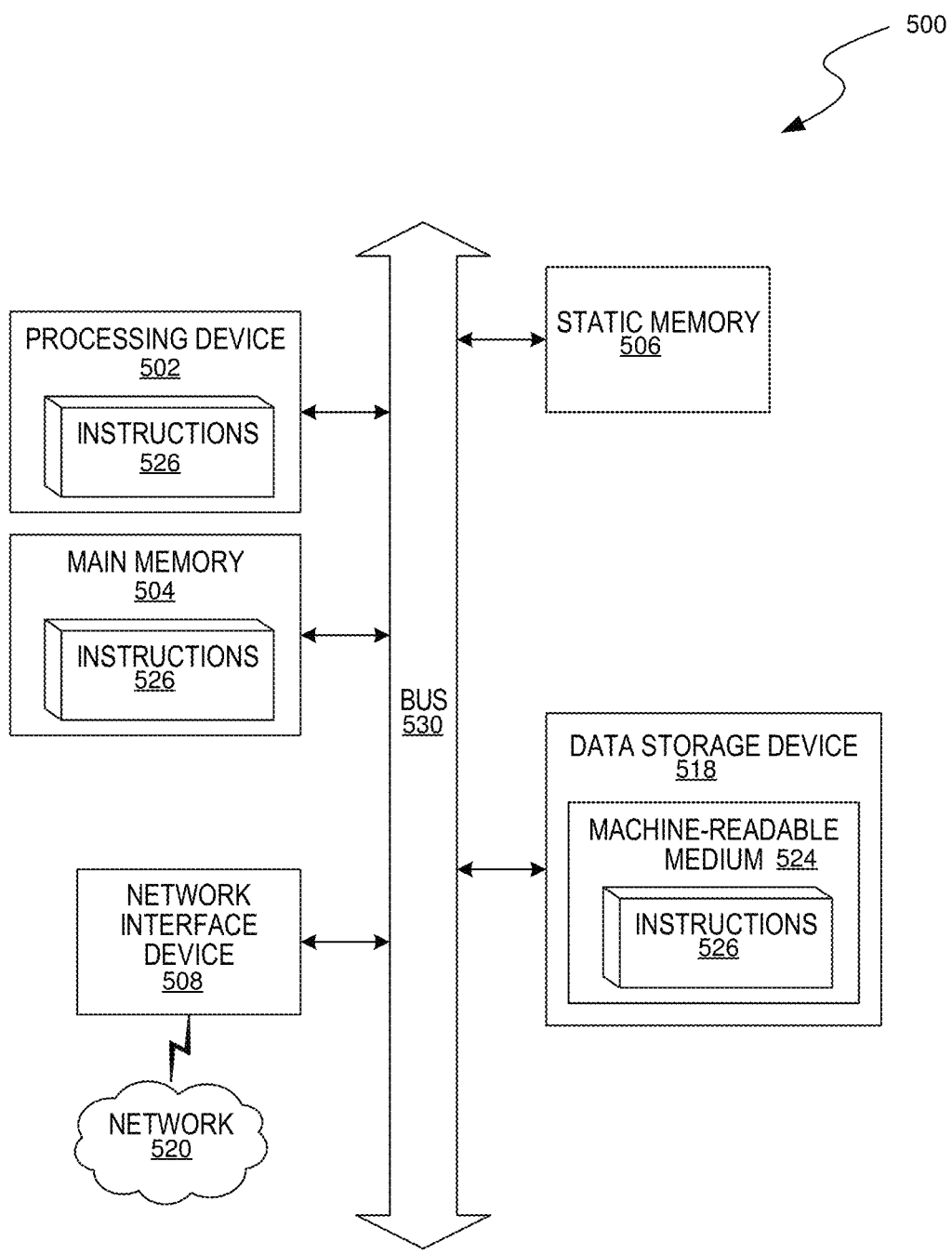
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed in accordance with some embodiments of the present disclosure. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the endurance measurement engine 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a component configured to determine one or more endurance measures from performance margins and use them to classify memory devices (e.g., the endurance measurement engine 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components and blocks illustrated in FIGS. 1-5 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Although the subject matter has been described in language specific to structural features and/or methodological acts, it is to be understood that the subject matter defined in the appended claims is not necessarily limited to the specific features or acts described above. Specific embodiments and implementations have been described herein for purposes of illustration, but various modifications can be made without deviating from the scope of the embodiments and implementations. The specific features and acts described above are disclosed as example forms of implementing the claims that follow. Accordingly, the embodiments and implementations are not limited except as by the appended claims.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

I claim:

1. A method comprising:
in response to identifying a metric compute trigger, computing a metric point based on cumulative distribution function (CDF)-based data;
storing the metric point in a log corresponding to a memory device;
fitting at least one of the metric points, from the log related to the memory device, to a function; and
computing an endurance measure by extrapolating the function to a point at which the function reaches a threshold.

2. The method of claim 1, wherein computing the metric point comprises:
obtaining quality measures for the memory device;
converting the quality measures into the CDF-based data;
obtaining an error amount threshold condition;
obtaining an acceptable memory unit failure rate;
computing a specific quality measure by determining an error amount indicated by the CDF-based data at the acceptable memory unit failure rate; and
computing a comparison between the specific quality measure and the error amount threshold condition.

3. The method of claim 2,
wherein the error amount threshold condition specifies an error amount correlated to data recovery speed; or
wherein the error amount threshold condition specifies an error amount above which errors are not recoverable by a processing device operably coupled to the memory device.

4. The method of claim 1 further comprising, prior to fitting at least some of the metric points to the function, determining that there are sufficient metric points in the log related to the memory device to fit with the function.

5. The method of claim 1, wherein the method is initiated in response to one of:
a dynamic program step (DPS) update;
a timer reaching a threshold;
an indication that a threshold number of drive fills have occurred; or
an indication that a threshold number of I/O operations have occurred.

6. The method of claim 1, wherein the endurance measure is used to predict a number of program/erase cycles that the memory device can perform before the memory device fails.

7. The method of claim 1, wherein the endurance measure is used to sort the memory device into a category based on a comparison between the endurance measure for the memory device and endurance measures computed for other memory devices.

8. The method of claim 7, wherein the category is used to select memory devices with similar endurance measures for incorporation into a memory sub-system.

9. A system comprising:
a memory component; and
a processing device, operably coupled with the memory component, to:
compute each of multiple metric points by analyzing a graph corresponding to quality measures for the memory component, wherein the analyzing comprises one or more of:
determining a margin between a specified point in the graph and an error amount threshold condition; or
determining an area under at least a specified portion of the graph;
fit at least some of the multiple metric points to a function; and
compute an endurance measure by extrapolating the function to a point at which the function reaches a performance threshold.

10. The system of claim 9,
wherein the analyzing comprises the determining a margin between the specified point in the graph and the error amount threshold condition; and
wherein the error amount threshold condition specifies either:
an error amount above which errors are not recoverable by a controller of the memory device; or
an error amount correlated to data recovery speed.

11. The system of claim 9, wherein the memory device is a negative-and (NAND) die or a block of a NAND die.

12. The system of claim 9, wherein the endurance measure is used to predict a number of program/erase cycles that the memory device can perform before the memory device fails.

13. The system of claim 9,
wherein the endurance measure is used to sort the memory device into a category based on a comparison between the memory device's endurance measure and endurance measures computed for other memory devices;
wherein the category is used to select memory devices with similar endurance measures; and
wherein a memory system created using the selected memory device is classified based on the category.

14. A non-transitory computer-readable storage medium comprising instructions that, when executed by one or more processing devices, cause the one or more processing devices to:
sort multiple die according to a combined endurance measure computed for each particular die of the multiple die;
wherein each combined endurance measure for each particular die is computed by:
selecting a set of multiple blocks from the particular die; and
combining endurance measures, one endurance measure computed for each particular block of the selected set of multiple blocks, wherein each endurance measure is computed by:
computing multiple data points for the particular block, wherein each particular data point is based on a comparison between:
a specific quality measure determined, at a specified acceptable memory unit failure rate, in cumulative distribution function (CDF)-based data for the particular block; and
an error amount threshold condition;
fitting at least some of the multiple data points for the particular block to a function; and
extrapolating the function to an intersection point at which the function reaches a threshold, wherein a value of the intersection point is the endurance measure for the particular block.

15. The computer-readable storage medium of claim 14, wherein selecting the set of blocks from each the particular die is performed by selecting random blocks from the particular die.

16. The computer-readable storage medium of claim 14, wherein selecting the set of blocks from each the particular die is performed by selecting a set of blocks that are each at least a threshold distance from the other selected blocks on the particular die.

17. The computer-readable storage medium of claim 14,
wherein the sorting results includes sorting results into multiple groupings;
wherein at least one of the groupings is a grouping for die with combined endurance measures above a threshold; and
wherein multiple of the die in the at least one grouping is selected to create a memory system classified as having superior performance.

18. The computer-readable storage medium of claim 14, wherein the error amount threshold condition specifies an error amount above which errors are not recoverable by a processing device operably coupled to the particular die.

19. The computer-readable storage medium of claim 14, wherein combining the endurance measures is performed by taking an average of the endurance measures.

20. The system of claim 9, wherein the analyzing comprises the determining an area under at least a specified portion of the graph.

* * * * *